United States Patent
Reinmuth et al.

(10) Patent No.: US 8,679,975 B2
(45) Date of Patent: Mar. 25, 2014

(54) METHOD FOR FORMING TRENCHES IN A SEMICONDUCTOR COMPONENT

(75) Inventors: Jochen Reinmuth, Reutlingen (DE); Barbara Will, Herrenberg (DE); Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 243 days.

(21) Appl. No.: 13/004,599

(22) Filed: Jan. 11, 2011

(65) Prior Publication Data

US 2011/0169125 A1    Jul. 14, 2011

(30) Foreign Application Priority Data

Jan. 14, 2010   (DE) .......................... 10 2010 000 888

(51) Int. Cl.
*H01L 21/60* (2006.01)

(52) U.S. Cl.
USPC ................. 438/675; 438/5; 438/14; 438/15; 438/706; 438/942

(58) Field of Classification Search
USPC ....................... 438/945; 257/E21.506, E29.02
See application file for complete search history.

(56) References Cited

U.S. PATENT DOCUMENTS

| | | | |
|---|---|---|---|
| 2004/0106290 A1* | 6/2004 | Erratico et al. | 438/689 |
| 2005/0095814 A1* | 5/2005 | Zhu et al. | 438/459 |
| 2006/0186498 A1* | 8/2006 | Mori et al. | 257/431 |
| 2008/0142928 A1 | 6/2008 | Sitaram et al. | |
| 2009/0140428 A1* | 6/2009 | Bonilla et al. | 257/751 |

FOREIGN PATENT DOCUMENTS

DE    10 2007 059 337    7/2008

* cited by examiner

*Primary Examiner* — Angel Roman
(74) *Attorney, Agent, or Firm* — Kenyon & Kenyon LLP

(57) ABSTRACT

A method is described for creating at least one recess in a semiconductor component, in particular a micromechanical or electrical semiconductor component, having the following steps: applying at least one mask to the semiconductor component, forming at least one lattice having at least one or more lattice openings in the mask over the recess to be formed, the lattice opening or lattice openings being formed as a function of the etching rate and/or the dimensioning of the recess to be formed; forming the recess below the lattice.

25 Claims, 4 Drawing Sheets

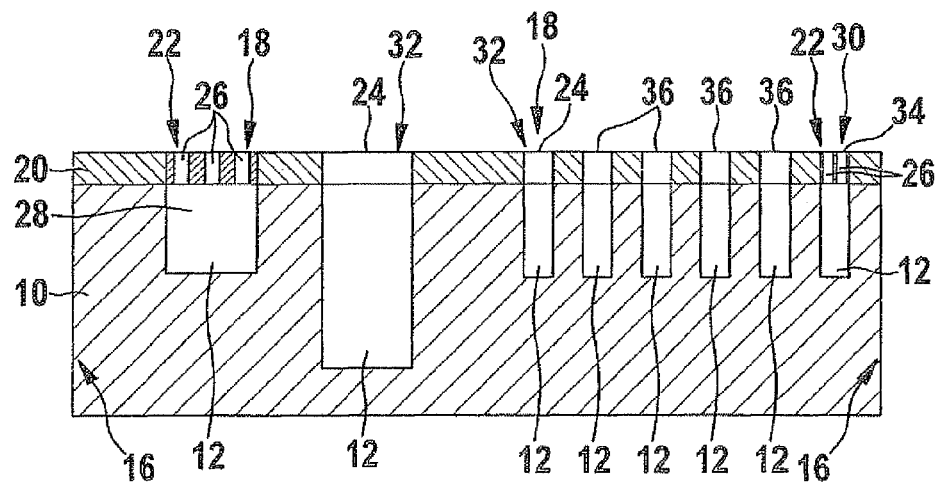
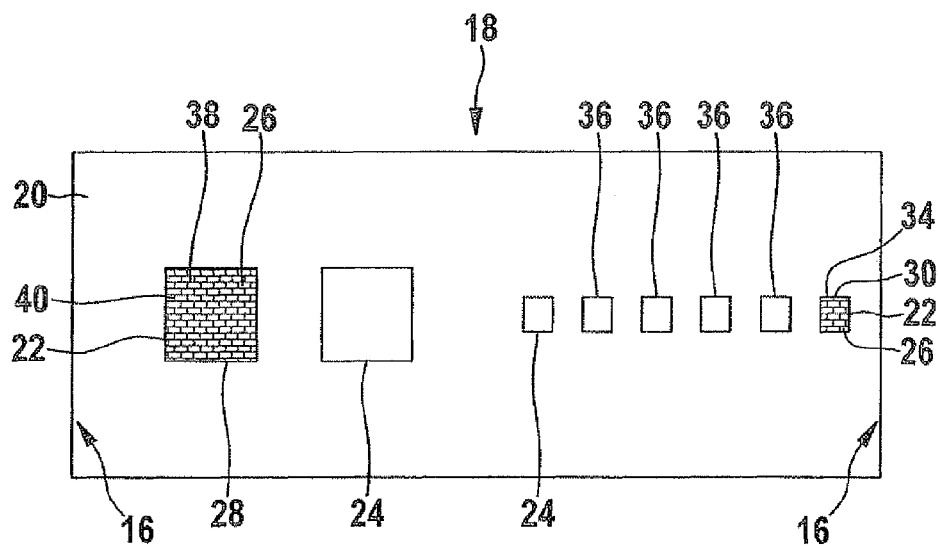
Fig. 2a
Fig. 2b

METHOD FOR FORMING TRENCHES IN A SEMICONDUCTOR COMPONENT

RELATED APPLICATION INFORMATION

The present application claims priority to and the benefit of German patent application no. 10 2010 000 888.5, which was filed in Germany on Jan. 14, 2010, the disclosure of which is incorporated herein by reference.

FIELD OF THE INVENTION

The present invention relates to a method for forming at least one or multiple structures, for example, insulation trenches around corresponding through contacts, or separating trenches, etc., in a semiconductor component, and a semiconductor component having at least one such trench.

BACKGROUND INFORMATION

There are electrical contacts through a wafer or through a subarea of a wafer in greatly varying embodiments. These through contacts are becoming increasingly significant. If multiple components are placed vertically one on top of another, very beneficial and small-dimensioned arrangements may be obtained by integrating electrical through contacts into the component.

A micromechanical component is discussed in German patent document DE 10 2007 059 337 A1, which has multiple through contacts, in order to be able to interconnect the micromechanical component with another micromechanical component, for example.

As described in greater detail hereafter on the basis of FIGS. 1a and 1b and 1c, undesired effects occur during the etching of trenches in a substrate. Thus, because of the ARDE effect, trenches having different widths may not be etched to the same depth without a corresponding stop layer in a substrate. Furthermore, etching rate differences may occur, in the case of which the etching speed is accelerated at an edge of the substrate, for example. This effect is described as the so-called wafer edge effect.

SUMMARY OF THE INVENTION

A method is provided according to the exemplary embodiments and/or exemplary methods of the present invention for producing at least one recess in a semiconductor component, in particular a micromechanical or electrical semiconductor component, having the following steps:
  applying at least one mask to the semiconductor component,
  forming at least one lattice having at least one or more lattice openings in the mask over the recess to be formed, the lattice opening or lattice openings being formed as a function of the etching rate and/or the dimensioning of the recess to be formed;
  forming the recess below the lattice.

The method has the advantage that, for example, recesses having various dimensions may be simultaneously etched into the substrate, the effect of the so-called ARDE effect and the wafer edge effect being able to be compensated for. In particular, for example, recesses having different widths but the same depth may be etched using the method according to the present invention, without an additional stop layer being required for this purpose.

Advantageous embodiments and refinements of the exemplary embodiments and/or exemplary methods of the present invention result from the further descriptions herein and the description with reference to the drawings.

The exemplary embodiments and/or exemplary methods of the present invention are explained in greater detail hereafter on the basis of the exemplary embodiments specified in the schematic figures of the drawings.

BRIEF DESCRIPTION OF THE DRAWINGS

FIG. 2a shows a sectional view through a substrate having trenches which are formed as per the method according to the present invention.

FIG. 2b shows a top view of the substrate and its mask according to FIG. 2a.

DETAILED DESCRIPTION

Figure 1A:
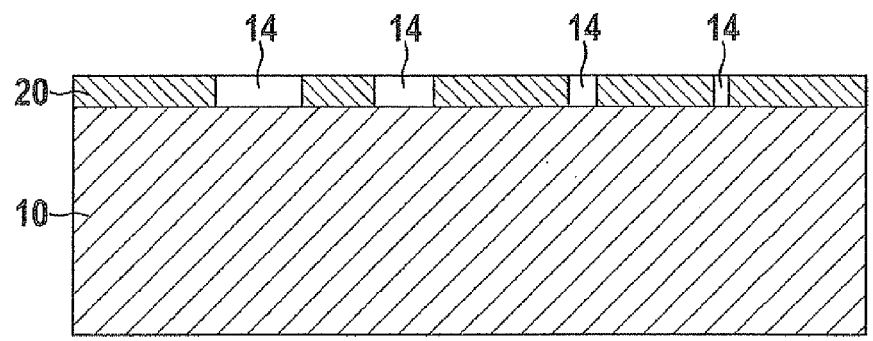
FIG. 1a shows a sectional view through a substrate, on which a mask is provided, in which openings of various sizes are structured for structures of various sizes to be etched.

In all figures, identical or functionally identical elements and devices—if not indicated otherwise—have been provided with the same reference numerals. Furthermore, the illustration of the wafer or semiconductor component in the following figures is purely schematic, not to scale, and greatly simplified.

A sectional view through a substrate 10 is shown as an example in FIG. 1a. A mask 20, an etching mask here, is provided on substrate 10. Openings 14 of various sizes for trenches of various sizes to be etched are formed in etching mask 20.

Figure 1B:
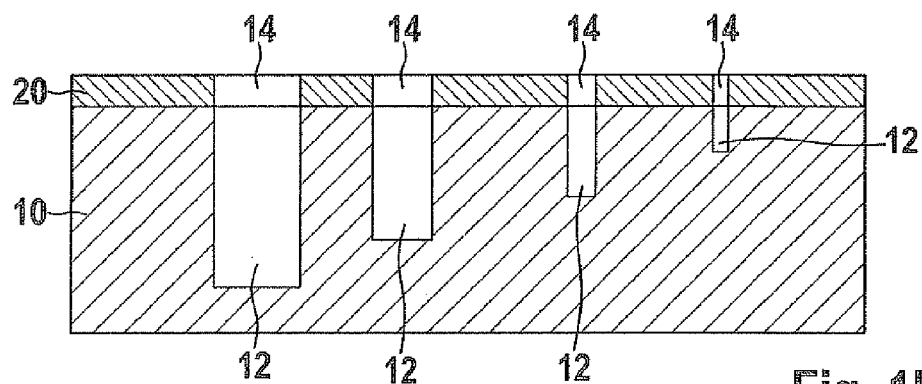
FIG. 1b shows a sectional view of the substrate according to FIG. 1a, in which trenches of various sizes or different widths were etched.

FIG. 1b shows a sectional view of substrate 10 according to FIG. 1a, into which trenches 12 having different sized openings 14 were etched or into which trenches 12 of various widths were etched. The so-called ARDE effect, which is described in greater detail hereafter, occurs in the process. Furthermore, an example of a substrate 10 is shown in a sectional view in FIG. 1c, into which trenches 12 of equal width were etched once on the edge and once in the middle of substrate 10.

In the case of a plasma-supported etching method, e.g., trenching, the etching rate is a function of the aspect ratio of the structure to be etched. Narrow holes or trenches 12 are etched more slowly in this case than wide holes or trenches 12. This effect is referred to in the literature as the so-called ARDE effect (aspect ratio dependent etching effect). This effect is primarily caused by differing diffusion speeds of the gases used during the etching process into the structure to be etched. The ARDE effect has the result that structures having different sizes are etched to different depths on a structured body, e.g., a silicon wafer, as shown as an example in FIG. 1b. In the example shown in FIG. 1b, larger or wider trenches 12 are etched more deeply than smaller or narrow trenches 12.

The ARDE effect was previously only to be influenced with difficulty in the related art. Thus, for example, during the trenching process, processes were performed at low temperatures below the freezing point to strengthen the passivation in the case of large structures, so that the effective etching rate is thus reduced in these structures. Special facilities are required for this purpose, which are capable of these low temperatures. However, the etching speeds for various structures to be etched on the wafer may not be influenced independently of one another using this method.

Figure 1C:
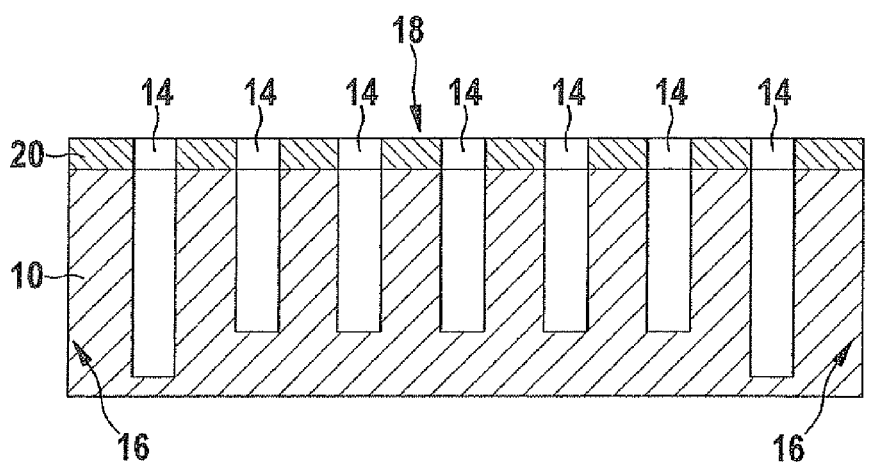
FIG. 1c shows a sectional view through a further substrate, in which trenches of equal size or equal width were etched at various points of the substrate.

In the substrate in FIG. 1c, various trenches 12 of equal width are etched into substrate 10, once close to edge 16 and once in interior 18 or in the middle of substrate 10. Local etching rate differences may occur, which are dependent on the layout, for example, and which are caused by locally differing etching gas consumption, for example. In the case of openings 14 close to the edge, an accelerated etching speed may frequently occur, in contrast to openings 14 which are closer to interior 18 or the middle of substrate 10. This is referred to as the so-called wafer edge effect. In the example shown in FIG. 1c, this has the result that trenches 12 are etched more deeply, for example, at the wafer edge or close to edge 16, in the case of equal trench width, than trenches 12 in interior 18 or in the middle of substrate 10.

A sectional view of a substrate 10 is illustrated as an example in FIG. 2a, in which trenches 12 were etched using the method according to the present invention. Furthermore, a top view of substrate 10 according to FIG. 2a is shown in FIG. 2b.

The method according to the present invention allows the etching rate to be individually reduced for any desired structure size, for example, the trench size here, on a substrate 10 and thus allows equal etching depths to be obtained over a substrate 10, without a stop layer having to be provided for this purpose and in spite of differing aspect ratios of the structure to be etched or systematic etching rate scattering. As per the method according to the present invention, the etching rates for any points on a substrate 10 may be set in any order to one another.

For this purpose, during the preparation of an etching mask 20 in the case of structures in which the etching rate is to be individually slowed, a lattice 22 or a fine perforated lattice is created in mask 20, instead of a single large opening 24 as shown in FIGS. 2a and 2b. The etching rate may be individually locally throttled via the size of holes 26 of perforated lattice mask 22 compared to a mask 20 having a single large opening 24. Perforated lattice mask 22 may be provided with holes 26 or openings in all conceivable shapes, holes or openings 26 of lattice 22 or mask 20 may thus be provided, for example, in the form of polygonal, round, and/or oval holes and may form, for example, oblong holes, honeycombed holes, rounded or round holes, etc. The etching process is executed in such a way that the many small structures which result due to perforated lattice mask 22 are connected by a suitably large undercutting width of perforated lattice mask 22 to form a single large structure. The diffusion process is slowed by perforated lattice mask 22. The etching depths of differing structures, for example, trenches 12 of different widths and/or different positions, may thus be adapted to one another, as shown in FIGS. 2a and 2b. A wide trench 12, 28 may be formed having the same depth as a corresponding narrow trench 12, 30 with the aid of perforated lattice mask 22, for example. If a standard mask 32 is used, which has only one large opening 24 over the particular trench, in contrast, wide trench 12 is etched much more deeply than narrow trench 12, as may be inferred from FIG. 1a. Similarly, if a standard mask is used and a stop layer is not provided, a trench at the edge is etched more deeply than an equally wide trench in the middle of the substrate, as shown in FIG. 1b.

As may be inferred from FIGS. 2a and 2b, the method according to the present invention has the advantage that the etching depths on a substrate 10 may be simultaneously set individually for each structure to be etched, e.g., trench 12, using a single mask 20. Typically, up to this point wide and narrow structures could only be etched to equal depths if the etching ended at a lower-lying stop layer. In other words, if a standard mask 32 is used, a stop layer must be provided in the case of wide trench 28 in the example in FIGS. 2a and 2b, in order not to etch it more deeply than corresponding narrow trench 30. Without such a stop layer, wide trench 28 has a greater depth than narrow trench 30 in FIG. 2a. Using the method according to the present invention, it is possible for the etching depths for various structure sizes to also be equal or at least approximately equal without a stop layer.

In addition, however, it is also possible through the method according to the present invention to etch narrow structures more deeply than wide structures (not shown), for example, in that the wide structures are accordingly greatly reduced in the etching rate by the opposing lattice. The strength of the effect of slowing the etching rate for a certain structure may be freely determined via the design of the lattice. The process and design freedoms for products without an etch stop layer resulting therefrom are manifold. Thus, three-dimensional structures may be etched out in the bulk material, for example, the structure work for the product being able to be optimized independently of the otherwise existing limitations due to the etching rate differences.

It is also possible to compensate for the etching rate differences on a substrate. There are typically etching rate distributions over the substrates, which may be a function of the process, the layout, and/or the etching chamber conditions. These distributions are a large problem for products which do not have a stop layer, but are sensitive to variations in the etching depth. The etching rates close to the edge of the substrate are typically increased compared to the etching rates in the substrate middle, as was previously shown on the basis of FIG. 1b.

Using the method according to the present invention, the etching rate may be slowed for the structures, e.g., trenches 12 close to the edge of the substrate here, by applying a suitable perforated lattice 22 as a perforated lattice mask 20 over structure 12 to be etched, in such a way that the etching depth distribution, as a function of the layout and the chamber, may be compensated for completely or nearly completely. For this purpose, for example, openings 34 close to the edge, in which the etching speed is to be slowed, obtain a closer-meshed perforated lattice 22 than the comparable structures, trenches 12 here, in substrate middle 18, which obtain a further perforated lattice 22 or also only a single opening 36 over the entire structure to be etched as mask 20, as shown in FIGS. 2a and 2b. Similarly, local etching rate differences as a function of the layout, for example, which are caused by locally differing etching gas consumption, for example, may be compensated for. Thus, for example, diaphragms without a stop layer may be created having a very high manufacturing tolerance on a substrate, as was not possible without the method according to the present invention.

The hole matrix of particular perforated lattice mask 22 may also have different densities over the entire structure to be etched, in order to thus positively influence the etching depth distribution over the entire structure to be etched itself. For example, a perforated lattice 22 may have holes 26 having equal or different dimensioning, for example, with respect to the shape and/or size, holes 26 being distributed at least partially or completely uniformly or non-uniformly in perforated lattice 22. Perforated lattice 22 may be arbitrarily varied with respect to the shape, the distribution, and/or the dimensioning of holes 26, depending on the function and intended purpose.

Very different topographies of the etching base may thus be created, which are advantageous for the product. Thus, for example, curves of the etching base which result during the normal etching process may be compensated for, whereby diaphragm thickness tolerances over the entire diaphragm may be improved, for example. Furthermore, etching bases in the form of a ramp, or the like, may also be created, for example, which may be advantageous for a product.

Both perforated lattices 22, as shown in FIG. 2b for two trenches 12, 28, 30, are shown merely schematically. Both perforated lattices 22, as in FIG. 2b, may be designed in greatly varying shapes or may be arbitrarily varied in their shape and/or dimensioning. Furthermore, a separate perforated lattice may be provided for each structure to be etched, the perforated lattices being able to have differently or identically shaped holes, hole sizes, hole distributions, etc., depending on the function and intended purpose.

Particular lattice 22 in the example in FIGS. 2a and 2b may thus be made up of, for example, individual adjacent webs 38 and/or transverse webs 40, webs 38 optionally being able to be connected to one another via additional transverse webs 40, as illustrated in FIG. 2b. Lattice openings 26, which are formed by webs 38 and transverse webs 40, may be offset to one another and may be situated in rows or may mutually overlap, as shown in FIG. 2b. Alternatively, lattice openings 26 may also be situated in series and not offset to one another (not shown). Furthermore, lattice openings 26 may be formed arbitrarily, for example, each as polygonal, for example, rectangular or square, round, and/or oval, as described above. Fundamentally, particular lattice openings 26 may have any shape and may each have the same size and/or shape or a different size and/or shape, depending on the function and intended purpose of lattice 22. Webs 38 and/or transverse webs 40 may also be dimensioned arbitrarily with respect to their length, width, and/or height or thickness, for example. Lattice 22 having its webs 38 and/or transverse webs 40 may also have a meandering design in this case, for example.

Lattice 22 or webs 38 and/or transverse webs 40 of lattice 22 are to be connected in some way to the edge of particular trench 12, however, so that lattice 22 does not more or less hang "in the air" after the formation of particular trench 12. Otherwise, this would have the result that lattice 22 would fall into trench 12 upon the formation thereof. For example, webs 38 are connected to one another via transverse webs 40 and are additionally connected to remaining mask 20 in the example in FIG. 2b. The present invention is not restricted to this special example, however.

Figure 3:
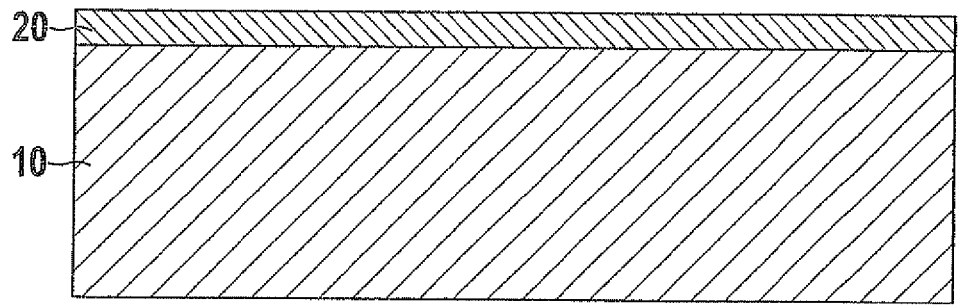
FIG. 3 shows a sectional view through a substrate which is provided with a mask as per the method according to the present invention.

A first step of the method according to the present invention is shown greatly simplified and merely as an example in FIG. 3. A substrate 10, for example, a wafer such as a silicon wafer, is provided. A mask 20, e.g., a resist mask or a so-called hard mask, is applied to substrate 10. Mask 20 has at least one dielectric layer, for example. In addition to a resist mask, however, any other masks, e.g., metal masks etc., which are suitable for the desired etching process, may also be used.

Figure 4:
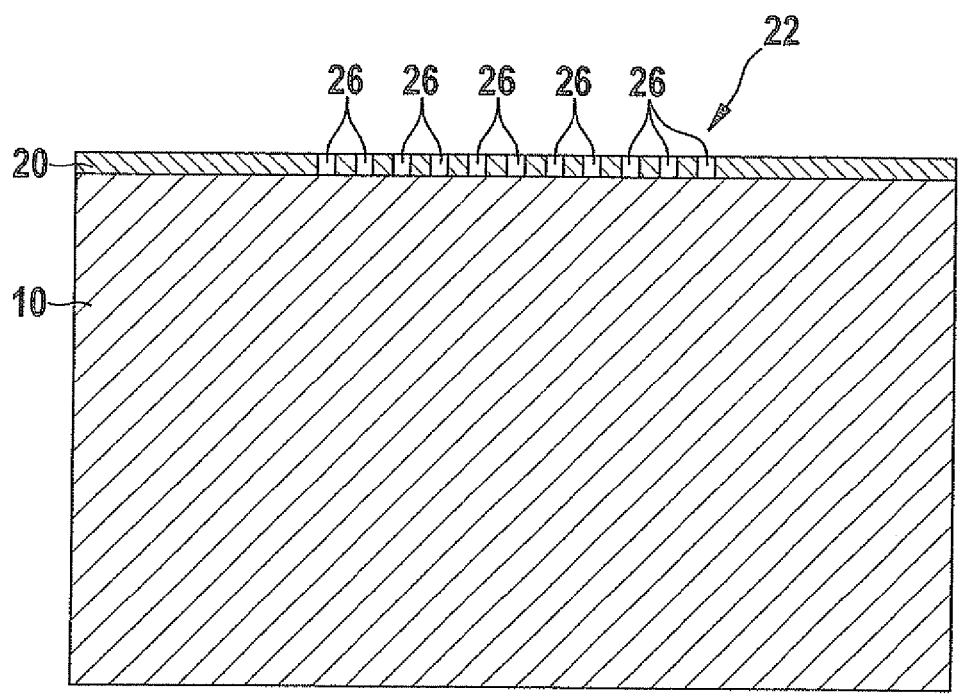
FIG. 4 shows the sectional view of the substrate according to FIG. 3, the mask being structured or provided with a lattice.

Furthermore, in FIG. 4, substrate 10 having mask 20, e.g., etching mask 20, according to FIG. 3 is shown, mask 20 being structured in FIG. 4 and being provided with a lattice 22, for example. Lattice 22 having its lattice openings 26 may be formed in such a way as to suitably set the etching rate or the etching speed and/or the dimensioning of the trench to be etched. Lattice 22 may be formed in such a way as to etch a trench 12 out of substrate 10 as shown as an example in following FIG. 5, having a predetermined width and/or depth, or to etch a cavity 42, as shown as an example in following FIG. 6, having a predetermined width/depth and/or distance from the lattice.

Mask 20 is distinguished in that where larger structures, e.g., trenches 12, are to be etched having a predetermined depth, for example, mask 20 may be formed having a narrow-meshed lattice 22 or a lattice 22 having many small lattice openings 26, in order to throttle the etching speed and thus shorten the etching depth of trench 12 to a desired extent or control the etching depth, for example. In contrast, for example, if smaller structures having a predetermined etching depth are etched, mask 20 may have a coarse-meshed lattice 22 or a lattice 22 having larger lattice openings 26 or alternatively even a lattice 20 having only one larger lattice opening, for example, depending on the size of the trench to be etched and the desired depth of the trench or etching depth, as was previously also shown as an example on the basis of FIGS. 2a and 2b. In FIG. 4, mask 20 is structured, for example, in such a way that it has a perforated lattice 22, having holes or lattice openings 26 of equal size, which are distributed or situated uniformly. The size and distribution of lattice openings 26 is set as a function of the desired etching speed or etching rate and/or etching depth, for example. Fundamentally, mask 20 may have a perforated lattice 22 having lattice openings 26 of equal size and/or different sizes, lattice openings 26 being distributed uniformly and/or non-uniformly, depending on the function and intended purpose.

Mask 20 may be under tensile stress to prevent sagging of lattice 22. However, mask 20 may also fundamentally be under compressive stress or may be essentially stress-free. Mask 20, which is released by undercutting, may be solely to remain sufficiently stable and is not itself to be damaged during the etching process, e.g., by cracking of web connections or similar events. Perforated lattice 22 must be connected to mask 20, which protects substrate 10 at other points of substrate 10 from an etching process, in such a way that it is maintained as a "shadow mask" during the entire etching process over the entire opening resulting as a whole through the connection of the partial openings of the structure to be etched. In other words, lattice 22 may not more or less float "freely" over the hole or trench after the etching of a hole or trench, since it would otherwise fall therein, but rather must be sufficiently connected to mask 20 so that perforated lattice 22 remains hanging over the hole after the etching of a hole. A certain amount of sagging of perforated lattice mask 22 is absolutely allowed, if the etching of the individual holes is not too excessively differently obstructed.

The precise design of the hole matrix defines the amount of throttling of the etching rate and the required undercutting width of the process, which is necessary to entirely or partially undercut the webs and/or transverse webs of perforated lattice mask 22 during the etching process, for example. For example, the hole sizes and the web widths which are to be undercut are to be considered in the selection of lattice 22. Lattice 22 may be differently designed individually for every desired structure to be etched on substrate 10, in order to thus adapt the etching rates for each structure on substrate 10 to the desired extent in the case of simultaneous etching of all structures of a substrate 10. Lattice 22 may be designed in such a way that tensions in subsequently freestanding perforated lattice mask 22 may be optimally dissipated, for example.

Linear or also curved or meandering webs or transverse webs may be used, for example. Perforated lattice 22 may also be optimized in such a way that perforated lattice mask openings 26 may be closed again as simply as possible by further processing steps after the etching process.

Figure 5:
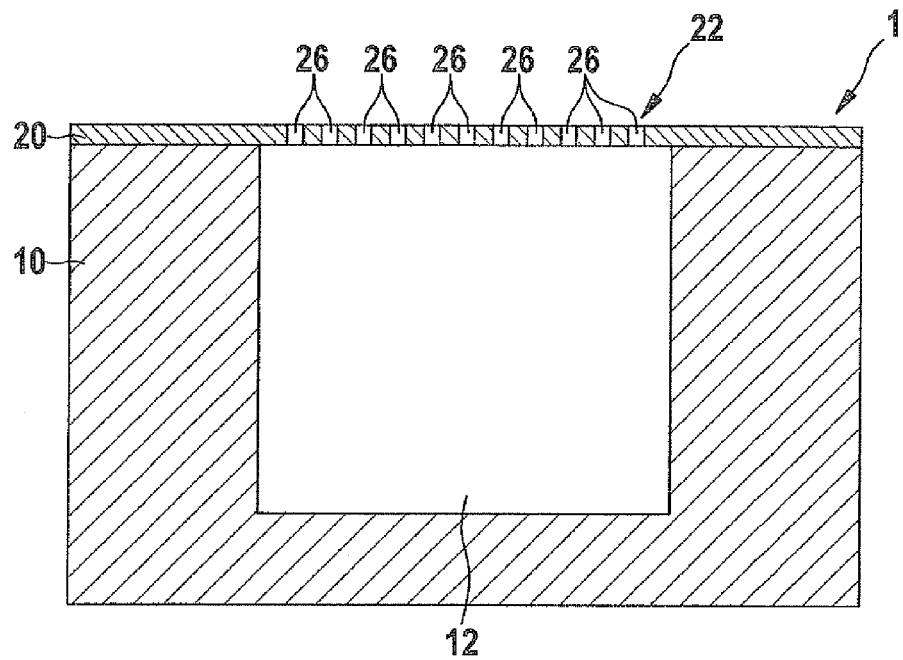
FIG. 5 shows a sectional view through a substrate, in which the substrate is etched directly below the lattice as per the method according to the present invention.

An example of a wafer 1 is shown in FIG. 5, in which etching is performed directly below etching mask 20 as per the method according to the present invention.

Employed mask 20 having perforated lattice 22, such as a relatively dense perforated lattice 22 here having many openings 26 per unit of lattice area, for example, is used hereafter for an etching process. This may be an isotropic etching process and/or an anisotropic etching process, for example. The method has particularly advantageous effects in the case of anisotropic etching processes, such as the trenching process. The processing parameters for the etching steps and passivation steps are suitably selected in such a way that partial or complete undercutting below the fine webs and/or transverse webs of perforated lattice mask 22 occurs directly below perforated lattice mask 22, as shown in FIG. 5.

The undercutting of the fine webs and/or transverse webs may also be performed in a processing step following the trenching. The passivation layer, which resulted during the trenching, is initially suitably removed. Subsequently, the silicon walls, which are located below the fine webs and/or transverse webs of mask 22, are removed using what may be an isotropic etching method. The etching process is continued until the desired target depth is reached. In the case of the isotropic etching method, a gas such as $SF_6$, $ClF_3$, and/or $XeF_2$ or another suitable gas may be used.

Figure 6:
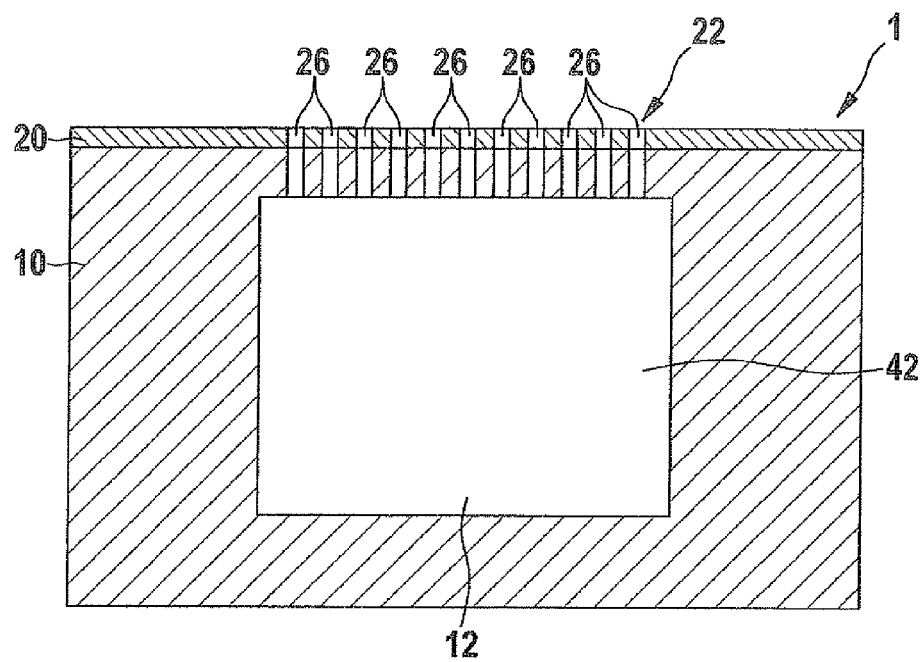
FIG. 6 shows a sectional view through a further substrate, in which the substrate is etched at a predetermined distance below the lattice as per the method according to the present invention.

An example of a wafer 1 is shown in FIG. 6 in which etching is first performed at a certain distance below mask 20 as per the method according to the present invention.

Employed mask 20 having perforated lattice 22 and its openings 26 is used hereafter for an etching process. This may also be an isotropic etching process and/or an anisotropic etching process, for example. The method has particularly advantageous effects in the case of anisotropic etching processes, e.g., the trenching process. For this purpose, the processing parameters for the etching steps and passivation steps are suitably selected in such a way that partial or complete undercutting below the fine webs and/or transverse webs of mask 20 initially occurs at a specific distance below perforated lattice mask 22, as shown in FIG. 6, a cavity 42 being formed in FIG. 6. The undercutting of the webs and/or transverse webs may also be performed in a processing step following the trenching, as previously described. The passivation layer resulting during the trenching is initially suitably removed in this case. The silicon walls, which are located below the fine webs and/or transverse webs of the mask, are then removed using what may be an isotropic etching method. The etching process is continued until the desired target depth is reached.

Mask 20, as is used in the method according to the present invention, may either be removed after the etching process, or used for the further processing, e.g., for a closure of the etched structure. The closure of lattice 22 of mask 20 may be partially or entirely performed using one or more layers, for example, at least one dielectric layer, metal layer, and/or polymer layers. The metal layer may be made up of a metal or a metal alloy. Depending on the combination of the individual layers, the stability of the closure of lattice 22 may be increased, if a particularly wide trench was formed, for example. Layers or layer stacks which are under tensile stress are particularly favorable in this case. Fundamentally, however, one or more layers which are under compressive stress may be used, or one or more of these layers under compressive stress may be combined with at least one or more layers which are under tensile stress. A layer under compressive stress may be combined with at least one layer under tensile stress in such a way that the compressive stress of the layer under compressive stress is at least reduced or is essentially compensated for. For example, a layer made of metal or a metal alloy may be used as a layer under compressive stress, while, for example, a corresponding dielectric layer, a SiN layer, or a TEOS layer may be used as a layer under compressive stress. A layer under compressive stress may have a compressive stress of less than or equal to 400 MPa, for example. Fundamentally, the process of applying the particular trench through a particular lattice and the thickening of the lattice using a layer deposition or filler layer deposition until the lattice closes the trench may be incorporated into a process flow at any desired point. This is true for all specific embodiments of the present invention.

The method according to the present invention may be used, for example, to create thin diaphragms of sensors, such as pressure sensors. The tolerances for the sensor diaphragm may be suitably narrowed therein, whereby new pressure ranges for measurements are achievable. The method may also be used for creating cap wafers, for example, which also require a very narrowly specified thickness of a diaphragm, in order to check the tightness of bond connections, for example. Furthermore, for example, monocrystalline springs for acceleration sensors, for example, may be created in an improved way using the method according to the present invention. The method according to the present invention generally allows new design freedom for the design of three-dimensional structures without a stop layer.

Although the present invention was described on the basis of the exemplary embodiments, it is not restricted thereto, but is rather modifiable in manifold ways. The above-mentioned specific embodiments may be combined with one another, in particular individual features thereof. The exemplary embodiments and/or exemplary methods of the present invention may be used in particular for manufacturing sensors, such as acceleration sensors and yaw-rate sensors. The method may also be used as an insulation method in CMOS or BCD processes.

What is claimed is:

1. A method for forming at least one recess in a semiconductor component, the method comprising:
applying at least one mask to the semiconductor component;
forming a lattice having a plurality of lattice openings in the mask; and
forming a first recess below the lattice,
wherein a size or density of the lattice openings are selected to set a value of an etching rate during the forming of the recess.

2. The method of claim 1, wherein at least one of a number, shape, dimensioning, and distribution of the lattice openings is selected to set the value of the etching rate during the forming of the recess.

3. The method of claim 1, wherein the mask has at least one of at least one dielectric layer, one metal layer, and one polymer layer.

4. The method of claim 1, wherein the mask is one of a hard mask and a solid mask, which is one of a metal mask and a dielectric mask, and wherein the lattice openings in the lattice of the mask are formed using at least one of an isotropic etching process and an anisotropic etching process, which is a trenching process.

5. The method of claim 1, wherein the recess is formed by etching through the lattice, and wherein at least one of an isotropic etching process, an anisotropic etching process, and a trenching process is performed as the etching process.

6. The method of claim 1, wherein the lattice, having smaller lattice openings, is formed for at least one of a wider recess and a recess close to the edge, and wherein for at least one of a narrower recess and a recess in the inner area of the semiconductor component a second lattice having larger lattice openings is formed in the mask.

7. The method of claim 1, wherein the lattice openings of the lattice, including one of a size, a distribution, and a matrix of the lattice openings, are formed so that at least one of a predetermined etching rate, an undercutting depth, and an undercutting width of the recess to be formed is settable.

8. The method of claim 1, wherein the lattice having its lattice openings is formed so that the structures resulting during the etching process through the lattice openings are connected by a suitably selected undercutting width of the lattice to form a single large structure, which forms the predetermined recess.

9. The method of claim 1, wherein the lattice has at least one of webs and transverse webs to form the lattice openings, and wherein the at least one of the webs and the transverse webs are connected at least one of to one another and to at least the mask, including at least a part of or all lattice openings of the lattice being formed at least one of situated offset to one another and situated adjacent to one another.

10. The method of claim 1, wherein the lattice is formed having one of a meandering shape and a meandering pattern.

11. The method of claim 1, wherein the lattice openings are closable by depositing at least one of at least one dielectric layer, a polymer layer, and a metal layer.

12. The method of claim 1, wherein the lattice is formed at a first location of the semiconductor component, a second recess is formed at a second location of the semiconductor component, and the size or density of the lattice openings is selected to set a value of the etching rate during the forming of the recess relative to a value of a second etching rate during the forming of the second recess.

13. The method of claim 12, wherein the first and second recesses are formed simultaneously.

14. The method of claim 12, wherein the size or density of the lattice openings are selected so that the first and second recesses have at least one of: different widths but substantially the same depths, or substantially the same widths but different depths.

15. The method of claim 12, wherein the semiconductor component is a semiconductor wafer and at least one of the first or second locations is closer to a center of the wafer than the other of the first or second locations.

16. A method for forming a plurality of recesses in a semiconductor component, the method comprising:
applying a mask to the semiconductor component;
forming first and second lattices in the mask over respective first and second locations of the semiconductor component; and
forming respective first and second recesses below the first and second lattices,
wherein the first and second lattices have opening sizes or densities selected to set a value of a first etching rate when forming the first recess relative to a value of a second etching rate when forming the second recess.

17. The method of claim 16, wherein the first and second lattices have different opening sizes or densities to produce different first and second etching rates when forming the first and second recesses.

18. The method of claim 16, wherein the first and second recesses are formed simultaneously.

19. The method of claim 16, wherein the lattice opening sizes or densities are selected so that the first and second recesses have at least one of: different widths but substantially the same depths, or substantially the same widths but different depths.

20. The method of claim 16, wherein the semiconductor component is a semiconductor wafer and the first location is closer to a center of the wafer than the second location.

21. A method for forming a plurality of recesses in a semiconductor component, the method comprising:
applying a mask to the semiconductor component;
forming a lattice in the mask over a first location of the semiconductor component;
forming a single hole in the mask over a second location of the semiconductor component; and
forming first and second recesses respectively below the lattice and the single hole,
wherein the lattice has an opening size or density, and the single hole has a size, selected to set a value of a first etching rate when forming the first recess relative to a value of a second etching rate when forming the second recess.

22. The method of claim 21, wherein the lattice has an opening size or density, and the single hole has a size, to produce different first and second etching rates when forming the first and second recesses.

23. The method of claim 21, wherein the first and second recesses are formed simultaneously.

24. The method of claim 21, wherein the lattice opening size or density and the single hole size are selected so that the first and second recesses have at least one of: different widths but substantially the same depths, or substantially the same widths but different depths.

25. The method of claim 21, wherein the semiconductor component is a semiconductor wafer and at least one of the first or second locations is closer to a center of the wafer than the other of the first or second locations.

* * * * *